United States Patent [19]

Basol et al.

[11] Patent Number: 5,028,274
[45] Date of Patent: Jul. 2, 1991

[54] GROUP I-III-VI$_2$ SEMICONDUCTOR FILMS FOR SOLAR CELL APPLICATION

[75] Inventors: Bulent M. Basol, Redondo Beach; Vijay K. Kapur, Northridge, both of Calif.

[73] Assignee: International Solar Electric Technology, Inc., Inglewood, Calif.

[21] Appl. No.: 362,707

[22] Filed: Jun. 7, 1989

[51] Int. Cl.$^5$ .................. H01L 31/072; H01L 31/18; H01L 31/0272

[52] U.S. Cl. .................................. 136/264; 136/260; 136/262; 136/265; 357/16; 357/30; 427/76; 437/5; 437/232

[58] Field of Search ................. 437/5, 232; 427/76; 136/260, 262, 264, 265; 357/16, 30 B, 30 E, 30 J, 30 K

[56] References Cited

U.S. PATENT DOCUMENTS

| | | | |
|---|---|---|---|
| 4,335,266 | 6/1982 | Mickelsen et al. | 136/260 |
| 4,465,575 | 8/1984 | Love et al. | 204/192.26 |
| 4,581,108 | 4/1986 | Kapur et al. | 204/37.1 |
| 4,684,761 | 8/1987 | Devaney | 136/258 |
| 4,798,660 | 1/1989 | Ermer et al. | 204/192.17 |
| 4,915,745 | 4/1990 | Pollock et al. | 136/265 |

OTHER PUBLICATIONS

M. Kwietniak et al., *Proceedings, 4th E.C. Photovoltaic Solar Energy Conference* (1982), pp. 727–731.

V. K. Kapur et al., *Conference Record, 17th IEEE Photovoltaic Specialists Conference* (1984), pp. 777–780.

S. Wagner et al., *Appl. Phys. Lett.*, vol. 25, pp. 434–435 (1974).

S. P. Grindle & C. W. Smith, "Preparation and Properties of CuInS$_2$ Thin Films Produced by Exposing RF Sputtered Cu-In Films to an H$_2$S Atmosphere," *Applied Physics Letters*, vol. 35, p. 24 (1979).

J. J., Binsma & H. A. van der Linden, "Preparation of Thin CuInS$_2$ Films via a Two-Stage Process," *Thin Solid Films*, vol. 97, p. 237 (1982).

Chu et al., "Large Grain CuInSe$_2$ Films" *J. Electrochemical Society*, vol. 131, p. 2182 (1984).

V. K. Kapur et al., "Low Cost Thin Film Chalcopyrite Solar Cells," Proceedings of the 18th IEEE Photovoltaic Specialists Conference, IEEE, N.Y. (1985), p. 1429.

V. K. Kapur et al., "Low Cost Methods for Production of Semiconductor Films for CuInSe$_2$/Cds Solar Cells," *Solar Cells*, vol. 21, p. 651 (1987).

G. Hodes et al., "Electroplated CuInS$_2$ and CuInSe$_2$ Layers: Preparation and Physical and Photovoltaic Characterization," *Thin Solid Films*, vol. 128, p. 93 (1985).

B. Dimmler et al., Proceedings of the 20th IEEE Photovoltaic Specialists Conference, IEEE, New York, 1988, Structure & Morphology of Evaporated Bylayer and Selenized CuInSe$_2$Films.

G. Hodes & D. Cahen, "Electrodeposition of CuInSe$_2$ and CuInS$_2$ Films," *Solar Cells*, vol. 16, p. 245 (1986).

*Primary Examiner*—Aaron Weisstuch
*Attorney, Agent, or Firm*—Christie, Parker & Hale

[57] ABSTRACT

This invention relates to an improved thin film solar cell with excellent electrical and mechanical integrity. The device comprises a substrate, a Group I-III-VI$_2$ semiconductor absorber layer and a transparent window layer. The mechanical bond between the substrate and the Group I-III-VI$_2$ semiconductor layer is enhanced by an intermediate layer between the substrate and the Group I-III-VI$_2$ semiconductor film being grown. The intermediate layer contains tellurium or substitutes therefor, such as Se, Sn, or Pb. The intermediate layer improves the morphology and electrical characteristics of the Group I-III-VI$_2$ semiconductor layer.

28 Claims, 4 Drawing Sheets

GROUP I-III-VI$_2$ SEMICONDUCTOR FILMS FOR SOLAR CELL APPLICATION

ORIGIN OF THE INVENTION

This invention was made with U.S. Government support under Contract No. SERI-XL-7-06031-6 awarded by the Department of Energy. The Government has certain rights in this invention.

FIELD OF THE INVENTION

This invention relates to thin film photovoltaic devices and methods of manufacturing them, and, more particularly, to a technique of depositing thin films of Group I-III-VI$_2$ semiconductors with improved properties. A tellurium-containing interface provided between a substrate and the deposited Group I-III-VI$_2$ semiconductor film improves the mechanical, structural and electrical characteristics of said Group I-III-VI$_2$ semiconductor film and allows the production of high efficiency photovoltaic devices on such films.

BACKGROUND OF THE INVENTION

A solar cell is an electronic device that converts sunlight directly into electricity. Although highly efficient solar cells have already been fabricated using single crystals of semiconductors such as Si, GaAs, and InP, it is generally accepted that large-scale terrestrial photovoltaic power generation will only be economical when low-cost, stable and highly efficient thin film polycrystalline solar cells are developed. Thin film devices require small amounts of materials which can be processed by economical mass production techniques.

Optical, electrical and mechanical characteristics of a semiconductor film determine its suitability for solar cell fabrication. Semiconductors with optical bandgap values in the range of 1.0–1.7 eV are commonly used in the absorber layers of solar cells. Materials with much wider optical bandgaps are transparent to most of the terrestrial solar spectra, and they are often employed as window layers in heterojunction and homojunction device structures. Semiconductors with direct bandgaps have high optical absorption coefficients and can be successfully used in thin film polycrystalline solar cells which typically employ 1–5 microns thick absorber layers. In addition to its optical characteristics, electronic properties of a semiconductor such as its resistivity and minority carrier diffusion length are also important in determining the ultimate conversion efficiency attainable by a solar cell fabricated using that semiconductor. Mechanical and structural properties also play a role in device fabrication. A thin film solar cell consists of various layers of different materials deposited on a substrate. Non-optimized deposition conditions, stresses in the films and possible interactions between the various layers of materials constituting the device sometimes give rise to adhesion problems and pinholes in the active region of the cell. Such defects limit the conversion efficiency of the device and reduce its processing yield.

Group I-III-VI$_2$ semiconductors are important candidate materials for low-cost photovoltaic applications. Compounds of Cu with Ga, In, S, Te and Se are especially important for thin film solar cells since many of these compounds have optical bandgap values well within the terrestrial solar spectra. The most promising materials of this group are CuInSe$_2$, CuGaSe$_2$ and their alloys.

Interest in thin film CuInSe$_2$ solar cells was raised by the successful demonstration of a high efficiency heterojunction photovoltaic device on a single crystal of this material in 1974 (Wagner et al., *Applied Physics Letters*, vol. 25, p. 434, 1974). Since that date many researchers have explored various deposition techniques to prepare polycrystalline thin films of CuInSe$_2$ that are suitable for photovoltaic applications. These techniques include spray pyrolysis, compound electrodeposition, evaporation from the compound, sputtering from CuInSe$_2$ targets, sputtering from Cu and In selenide targets, reactive sputtering, elemental coevaporation of Cu, In and Se, and the two-stage process (selenization of elemental layers containing Cu and In). Although all of these techniques have successfully yielded thin films of CuInSe$_2$, efficient solar cells with conversion efficiencies approaching to or over 10% have only been fabricated on films prepared by the elemental coevaporation technique and the two-stage process.

The method of depositing CuInSe$_2$ thin films by coevaporating Cu, In and Se onto heated substrates has been pioneered by the Boeing research group. The details of the Boeing process is given in U.S. Pat. No. 4,335,266 awarded to R. A. Mickelsen and W. S. Chen ("Methods For Forming Thin-Film Heterojunction Solar Cells from I-III-VI$_2$ Chalcopyrite Compounds, and Solar Cells Produced Thereby," June 15, 1982). This patent describes a method of fabricating high-efficiency CuInSe$_2$/Cd(Zn)S heterojunction solar cells by the co-evaporation technique using a CuInSe$_2$ absorber film with graded stoichiometry, i.e. graded copper-to-indium ratio. The resistivity of CuInSe$_2$ is a very sensitive function of its stoichiometry. A high copper-to-indium ratio in this semiconductor gives low-resistivity material with p-type conduction. A low copper-to-indium ratio, on the other hand, yields either a higher resistivity p-type layer or even a n-type film depending upon the stoichiometry. According to a published data, resistivity of evaporated CuInSe$_2$ changes from about 0.1 ohm-cm to $10^4$ ohm-cm range as the copper-to-indium ratio varies from 1.1 to 0.9 (V. K. Kapur et al., "Metallization Systems for Thin Film CuInSe$_2$/CdS Solar Cells," *Proc. 17th IEEE Photovoltaic Specialists Conference*, IEEE, New York, 1984, p. 777). The solar cells reported in the above mentioned Boeing patent use a two-layer CuInSe$_2$ structure. This is achieved by first evaporating a low-resistivity, Cu-rich CuInSe$_2$ film on the metalized substrate, and then depositing a high-resistivity, In-rich layer on top of the low-resistivity film. The device is completed by evaporating a window layer over the In-rich CuInSe$_2$ layer. According to Boeing researchers, having a high resistivity CuInSe$_2$ region near the window layer of the solar cell is essential for obtaining high efficiency devices. If a single layer of low-resistivity p-type CuInSe$_2$ is used in the device structure then the deposition of the Cd(Zn)S window layer causes the formation of Cu-nodules at the CuInSe$_2$/Cd(Zn)S interface and the device efficiency is reduced. If a single layer of high-resistivity CuInSe$_2$ film is used, on the other hand, the electrical contact at the substrate/CuInSe$_2$ interface is adversely affected. According to the Boeing patent the low-resistivity CuInSe$_2$ layer at the ohmic contact interface provides good adhesion, low-contact resistance, a back surface field effect and large and uniform grain size, whereas the high-resistivity CuInSe$_2$ film near the junction area avoids the formation of Cu-nodules. CuInSe$_2$/CdS, and CuIn(Ga)Se$_2$/CdS devices with over 10% efficiency have been fabricated by many research groups in different countries using the Boeing process.

As an alternative to Boeing's co-evaporation technique, researchers at Atlantic Richfield Company have used the magnetron sputtering method to deposit CuInSe$_2$ films of varying compositions (R. B. Love and U. V. Choudary, "Method for Forming Photovoltaic Cells Employing Multinary Semiconductor Films," U.S. Pat. No. 4,465,575, Aug. 14, 1984). The proposed device structure of this patent was the same as Boeing's, i.e. a low-resistivity CuInSe$_2$ layer was first sputter deposited on the metalized substrate, followed by a high-resistivity CuInSe$_2$ film on which the window layer was formed. Attempts to use only one CuInSe$_2$ layer with uniform composition gave low-efficiency devices similar to Boeing results.

The two methods of preparing CuInSe$_2$ films described above involve reactive deposition. In other words, in these techniques Cu and In are evaporated or sputtered onto a selected substrate in the presence of Se and they react with Se during deposition. The two-stage process, however, is quite different in that it involves two separate steps: one to deposit the elemental components of the compound on a substrate and the other to react these components to form the compound. The following will review the prior art on this very promising technique.

The two-stage process involves depositing one or more of the elemental components of a compound in the form of a thin elemental layer on a substrate and then reacting these elemental components to form the desired compound. The thin layer of elements can be deposited onto the selected substrate by various techniques such as evaporation, sputtering and electroplating. The reaction can be carried out in an inert or reactive atmosphere depending upon the elemental species in the unreacted film.

Application of the two-stage process to the deposition of Group I-III-VI$_2$ semiconductors has been reported in 1979 (S. P. Grindle and C. W. Smith, "Preparation and Properties of CuInS$_2$ Thin Films Produced by Exposing RF Sputtered Cu-In Films to an H$_2$S Atmosphere," *Applied Physics Letters*, Vol. 35, p. 24, 1979) and in 1982 (J. J. Binsma and H. A. Van Der Linden, "Preparation of Thin CuInS$_2$ Films via a Two-Stage Process," *Thin Solid Films*, vol. 97, p. 237, 1982). These works have demonstrated that single phase CuInS$_2$ thin films could be obtained by sulfidizing metallic Cu/In stacked layers or Cu-In alloy films deposited on selected substrates by the sputtering method or by the molecular beam deposition technique.

Application of the two-stage process to the preparation of CuInSe$_2$ films was investigated in 1984 by Chu et al. in their paper entitled "Large Grain CuInSe$_2$ Films" (*J. Electrochemical Society*, Vol. 131, p. 2182, 1984). These authors obtained single phase, large grain CuInSe$_2$ layers by selenizing evaporated or electroplated Cu/In stacked layers in H$_2$Se atmosphere at elevated temperatures. However, no devices were demonstrated on these films at that time.

The attractive features of the electrodeposition technique as applied to obtaining CuInSe$_2$ films by the two-stage process have been described in U.S. Pat. No. 4,581,108, awarded to V. K. Kapur et al., and assigned to Atlantic Richfield Company ("Process of Forming a Compound Semiconductive Material," Apr. 8, 1986). In that patent, electroplating technique was used to deposit Cu/In stacked layers which were then selenized in Se containing atmosphere to obtain CuInSe$_2$ thin films. International Solar Electric Technology (ISET) research group has further developed this electrodeposition/selenization method and demonstrated efficient CuInSe$_2$/CdS solar cells using films obtained by this technique (see for example, V. K. Kapur et al., "Low Cost Thin Film Chalcopyrite Solar Cells," *Proceedings of the 18th IEEE Photovoltaic Specialists Conference*, IEEE, New York, 1985 p. 1429; and V. K. Kapur et al., "Low Cost Methods for Production of Semiconductor Films for CuInSe$_2$/CdS Solar Cells," *Solar Cells*, vol. 21, p. 650, 1987). A research group in Israel has also worked on the two-stage processing of CuInSe$_2$ using electrodeposition. In that work both Cu-In alloys and Cu/In stacked layers were electrodeposited and selenized to obtain CuInSe$_2$ films. The morphology of the selenized layers prepared by this group, however, was not suitable for solid state solar cell fabrication and no devices with appreciable efficiency values have been reported (see for example, G. Hodes et al., "Electroplated CuInS$_2$ and CuInSe$_2$ Layers: Preparation and Physical and Photovoltaic Characterization," *Thin Solid Films*, vol. 128, p. 93, 1985).

Evaporated and selenized Cu/In stacked layers have also been used for solar cell processing. D. Dimmler et al. report on a low-efficiency (4.1%) device that was fabricated on a CuInSe$_2$ film prepared by evaporating first a Cu then an In layer on a Mo coated substrate and then selenizing the resultant stack in Se vapor (B. Dimmler et al., *Proceedings of the 20th IEEE Photovoltaic Specialists Conference*, IEEE, New York, 1988). The low open circuit voltage and efficiency values observed in these devices were attributed to unfavorable defect structure and secondary phases present in the films.

A U.S. patent awarded to Atlantic Richfield Company (J. H. Ermer and R. B. Love, "Method for Forming CuInSe$_2$ Films," U.S. Pat. No. 4,798,660, Jan. 17, 1989) describes the use of the DC Magnetron sputtering technique to deposit first Cu then In layers on Mo coated substrates which are later selenized to obtain CuInSe$_2$ films.

It is important to note that as opposed to the reactive deposition techniques described earlier in this review of prior art the two-stage process does not intentionally deposit a CuInSe$_2$ film with graded stoichiometry. In this method either a Cu-In alloy or a Cu/In stacked layer is deposited on a metalized substrate and then the whole structure is selenized in an Se containing atmosphere at temperatures ranging from 350° C. to 650° C. During this selenization step Cu and In are believed to intermix and upon reacting with Se they form the CuInSe$_2$ compound. Most of the prior art examples of the two-stage process involve deposition of discrete layers of Cu and In onto metalized substrates. In all of these examples the Cu layer is deposited first on the ohmic contact metal and this is followed by the In layer deposition. Although there is a possibility that such a structure may yield a relatively Cu-rich region near the metalized substrate, the published data so far does not indicate any gradation of the copper-to-indium ratio through the thickness of films prepared by the two-stage process. Since the compound film formed by the two-stage process has a uniform stoichiometry through its thickness, Cu-nodule formation described in the Boeing patent cited earlier would be a problem if the CuInSe$_2$ has a low-resistivity. But if a high-resistivity single layer of $CuInSe_2$ were used as the absorber material of the solar cell then the contact resistance would limit the fill factor and the efficiency of the devices.

There is, therefore, a need to develop a device structure and a processing method that can yield high efficiency thin film Group I-III-VI$_2$ solar cells without requiring the use of the two-layer structure taught by the Boeing patent. Such new approach should allow the use of a single layer of high resistivity Group I-III-VI$_2$ semiconductor film as the photon absorber of the solar cell without any adverse effects on the device parameters. This would offer to the processing engineer the flexibility of being able to use different deposition techniques in device processing including those methods which may not easily lend themselves to the formation of a two-layer structure. The purpose of the present invention is to provide such a method.

Other problems commonly faced in attempting to use a single layer of high resistivity Group I-III-VI$_2$ semiconductor film for solar cell processing is the poor adhesion of this film to its substrate and its poor morphology. In the case of a two-layer structure used by Boeing and Atlantic Richfield Company, the low resistivity Cu-rich film is deposited first on the metalized substrate and it provides good adhesion, good electrical contact and uniform morphology to the high-resistivity layer grown on top of it. But in the absence of this Cu-rich layer, pinholes and film peeling may become a problem. This is discussed in our paper entitled "Low Cost Methods for the Production of Semiconductor Films for $CuInSe_2$/CdS Solar Cells," (*Solar Cells*, vol. 21, p. 65, 1987) for electroplated and selenized $CuInSe_2$ films. Similar concerns related to poor structural properties and mechanical integrity of films prepared by the two-stage process have also been raised by other groups (see for example, G. Hodes and D. Cahen, "Electrodeposition of $CuInSe_2$ and $CuInS_2$ Films," *Solar Cells*, vol. 16, p. 245, 1986; G. Hodes et al., "Electroplated $CuInS_2$ and $CuInSe_2$ Layers: Preparation and Physical and Photovoltaic Characterization," *Thin Solid Films*, vol. 128, p. 93, 1985).

From a review of the prior art it is clear that there is a need to develop new approaches to film growth methods that would yield Group I-III-VI$_2$ semiconductor films with good morphology and mechanical integrity and good electrical characteristics so that efficient thin film solar cells can be fabricated on such films. This present invention addresses all of these issues. It provides a means of obtaining films with good morphology, good adhesion and good electrical characteristics. It avoids the formation of metallic-nodules in the solar cell junction areas by facilitating the use of high-resistivity absorber layers without any adverse effects on device parameters.

SUMMARY OF THE INVENTION

This invention relates to an improved thin film solar cell with excellent electrical and mechanical integrity. The device comprises a substrate, a Group I-III-VI$_2$ semiconductor absorber layer and a transparent window layer. The mechanical bond between the substrate and the Group I-III-VI$_2$ semiconductor layer is enhanced by an intermediate layer between the substrate and the Group I-III-VI$_2$ film being grown. The intermediate layer contains tellurium or substitutes therefor, such as Se, Sn, or Pb. The intermediate layer improves the morphology of the Group I-III-VI$_2$ layer and it also provides low-resistance electrical contact between the substrate and the film.

In order to facilitate the understanding of the present invention, reference will now be made to the drawings and to some specific examples. Such examples, like the preceding summary, should not be construed as limiting the present invention which is properly set forth in the appended claims.

BRIEF DESCRIPTION OF THE DRAWINGS

FIG. 3b is a cross-sectional Scanning Electron Micrograph of the film of FIG. 3a demonstrating the poor adhesion between the substrate and the $CuInSe_2$ film of FIG. 3a;

DESCRIPTION OF PREFERRED EMBODIMENTS

Figure 1:
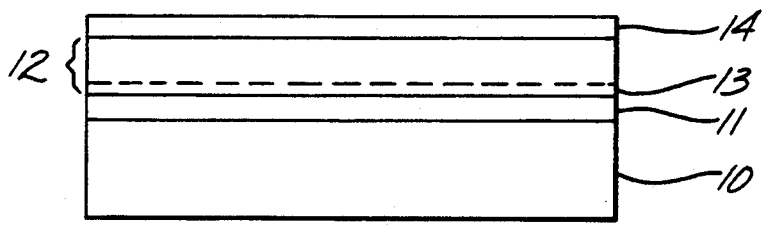
FIG. 1 is a cross sectional view of a solar cell made in accordance with the present invention.

Referring now to FIG. 1 of the drawings, there is illustrated a thin film solar cell constructed according to the present invention. The cell structure includes a first sheet 10 of a substrate material such as glass. On sheet 10 is a layer of a conductive material 11 such as Mo. On layer 11 is formed a film 12 of a Group I-II-VI$_2$ semiconductor employing the teachings of this invention. Layer 12 has a Te-containing region 13 on or near to the substrate interface. On the surface of the Group I-III-VI$_2$ semiconductor layer 12 is deposited a layer 14 of a transparent window material such as CdS which allows the incoming radiation to reach the junction area of the cell.

It should be noted that a variety of materials deposited by a variety of methods can be used to deposit the components of the device depicted in FIG. 1. For example, the substrate 10 can be made of any suitable rigid or flexible material, insulating or conductive. The only two conditions for the substrate 10 to satisfy are that it has to be compatible with the processing conditions used for depositing the conductive film or the Group I-III-VI$_2$ semiconductor film and it should not adversely affect the electrical, optical or mechanical properties of the rest of the layers used in the device structure. Possible substrate materials include but are not limited to sheets of glass or alumina, and sheets or foils of metals such as Mo, W, Ta, Ti, Au and stainless steel.

The contact layer 11 is made of a conductive material that provides a good ohmic contact to the Group I-III-VI$_2$ semiconductor film 12. Mo, W, Ta, Ti, Au and TiN are examples of materials that can be used in layer 11. The preferred material for layer 11 is Mo. It should be understood that layer 11 would not be needed if the substrate 10 were itself a conductive material such as a Mo foil or sheet that would provide good ohmic contact to the semiconductor layer 12.

The Group I-III-VI$_2$ semiconductor material that can be employed in the practice of this invention is selected from the group consisting of ternary or higher order selenides, sulfides and tellurides of Cu, Ag, Al, Ga, In, Tl and their alloys. The preferred material for layer 12 is CuIn$_{1-x}$Ga$_x$Se$_2$ (x=0 or x=1 or x between 0 and 1).

The Group I-III-VI$_2$ film 12 of this invention can be deposited by various techniques. These methods include but are not limited to evaporation, sputtering, electrodeposition and spraying. Group I-III-VI$_2$ film 12 may be formed during deposition on the substrate (as is the case in the co-evaporation or reactive sputtering techniques) or it may be formed after the deposition of elemental layers (as is the case in the two-stage process). The preferred method is the two-stage process.

The Te-containing region 13 may be formed by depositing a thin layer of Te on the conductive film 11 before the deposition of the Group I-III-VI$_2$ layer 12. Te can also be co-deposited during the early stages of the growth of the Group I-III-VI$_2$ film 12. Te deposition can be accomplished by various methods such as evaporation, electroplating, sputtering or spraying. The thickness of the Te-containing region 13 may change from a few mono-layers to over 2000 Angstroms depending upon the total thickness of the Group I-III-VI$_2$ film 12. The preferred thickness range for the Group I-III-VI$_2$ film of this invention is 1-5 microns.

The window layer 14 consists of one or more layers of transparent materials that are commonly used in solar cells. Examples of materials that can be used for layer 14 are semiconductors such as CdS, CdZnS, ZnSe, CdSe and their alloys and/or transparent conductive oxides such as indium tin oxide (ITO), tin oxide (TO), zinc oxide, cadmium oxide and cadmium stannate. These layers can also be used together to optimize the device performance. Examples for such optimized window layers are Cd(Zn)S/ZnO, Cd(Zn)S/ITO and Cd(Zn)S/ZnO/ITO structures. The thickness of the Cd(Zn)S films in these structures is kept small (typically thinner than 1000 Angstroms) and the transparent conductive oxides are used to provide the necessary conductivity and at the same time increase the transmission of light into the active region of the solar cell. The window layer materials of film 14 can be deposited by various techniques well known in the art and these deposition techniques do not constitute any part of the present invention. If a homojunction structure is needed instead of the heterojunction structure depicted in FIG. 1 then the window layer 14 is replaced by a thin film of the Group I-III-VI$_2$ layer 12 with opposite electrical conductivity type. A finger pattern may be deposited over the window layer 14 to reduce the sheet resistance of this layer. An AR coating can also be deposited to improve the efficiency of the finished solar cells. The electrical conductivity type of layer 12 in the preferred embodiment is p-type. The preferred type of the window layer 14 is n-type.

Figure 2:
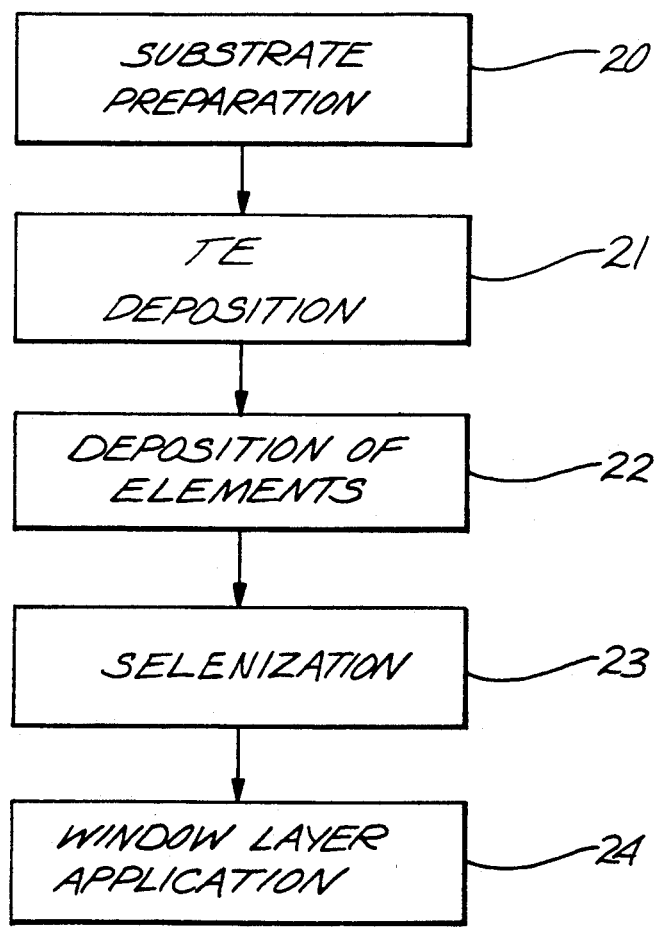
FIG. 2 is a flow chart describing a set of processing steps to obtain the solar cell depicted in FIG. 1.

FIG. 2 shows a processing sequence for obtaining an improved CuIn$_{1-x}$Ga$_x$Se$_2$ (x changing from 0 to 1) film and fabricating an efficient solar cell in accordance with the present invention. Step 20 of the processing sequence is the preparation of the substrate. This step consists of selecting the substrate 10 of FIG. 1 and depositing a contact layer 11 onto it. After the substrate preparation step 20, a thin layer of Te is deposited onto the contact layer 11. This is depicted as step 21 in FIG. 2. Step 22 involves the deposition of the elemental component layers (In, Cu and if desired, Ga) onto the thin Te film. The whole structure is selenized in step 23 and a CuIn$_{1-x}$Ga$_x$Se$_2$ film of good electrical and mechanical characteristics is obtained. The solar cell is completed by depositing the window layers and finger patterns (step over the formed CuIn$_{1-x}$Ga$_x$Se$_2$.

It should be appreciated that a variety of techniques can be employed in carrying out the steps of FIG. 2 and some changes can be made in the processing sequence without eliminating the benefits obtained from the teachings of the present invention. For example, the Te layer of step 21 can be deposited by a variety of techniques including electrodeposition, evaporation and different versions of sputtering. The thickness of this Te layer may change from a few mono-layers to over 2000 Angstroms depending upon the thickness of the Group I-III-VI$_2$ film obtained. The preferred thickness of the Te layer film, however, is in the range of 10-500 Angstroms. Although the Te film of step 21 is preferably deposited as a discrete layer it may also be co-deposited onto the contact film 11 along with the elemental components of the Group I-III-VI$_2$ material during the early stages of step 22. If the film to be obtained is CuInSe$_2$, the preferred deposition sequence for the elemental layers in step 22 calls for the In layer to be under the Cu layer. However, places of these layers in the stack can be interchanged as will be demonstrated in our Examples. Similarly, the In layer and the Cu layer may not be totally discrete layers. They may be totally or partially inter-diffused or a Cu-In alloy film with uniform or graded composition through its thickness may be deposited in step 22. If the Group I-III-VI$_2$ film to be obtained has Ga incorporated in it then the preferred deposition sequence in step 22 is first In then Cu and then Ga. Alternatively, however, In can be deposited as a discrete layer and Cu and Ga can be deposited as an alloy. Or all three elemental components may be deposited in the form of an alloy over the Te layer of step 21. The In, Cu and Ga layers and their various binary and ternary alloys may be deposited by a variety of techniques such as electrodeposition and physical vapor deposition (evaporation, various versions of sputtering etc.). After depositing the elemental components, the reaction (step 23) can be achieved by annealing the structure obtained in step 22 in a furnace at a temperature ranging from 350° C. to 600° C., the preferred range being 400° C. to 450° C. The reactive atmosphere in the furnace should contain Se vapors, preferably H$_2$Se gas. The furnace atmosphere in step 23 can be replaced by an inert gas or vacuum if Se is introduced into the structure of elemental components in step 22. Se can be introduced into the structure of the elemental components in step 22 as a discrete layer or it may be dispersed in the other layers of this structure. The annealing time in step 23 may change from a few minutes to many hours depending upon the thickness of the processed film and the processing temperature. The resulting film after step 23 may have a graded composition of its metallic elements (In and/or Ga through its thickness. Although the preferred embodiment of the present invention involves first the deposition of elemental layers and then the reaction of these layers to form the compound it should be appreciated that alternately a compound film can reactively be deposited over the tellurium layer of step 21 by various methods such as evaporation and sputtering. In this case steps 22 and 23 of FIG. 2 are replaced by the reactive deposition step.

The preferred embodiments of the present invention and method of making the same can best be described by reference to specific examples which will now be described.

EXAMPLES

Example 1

Effect of the Te-containing Interface on the Morphology and Adhesion of the CuInSe$_2$ Thin Films.

Figure 3A:
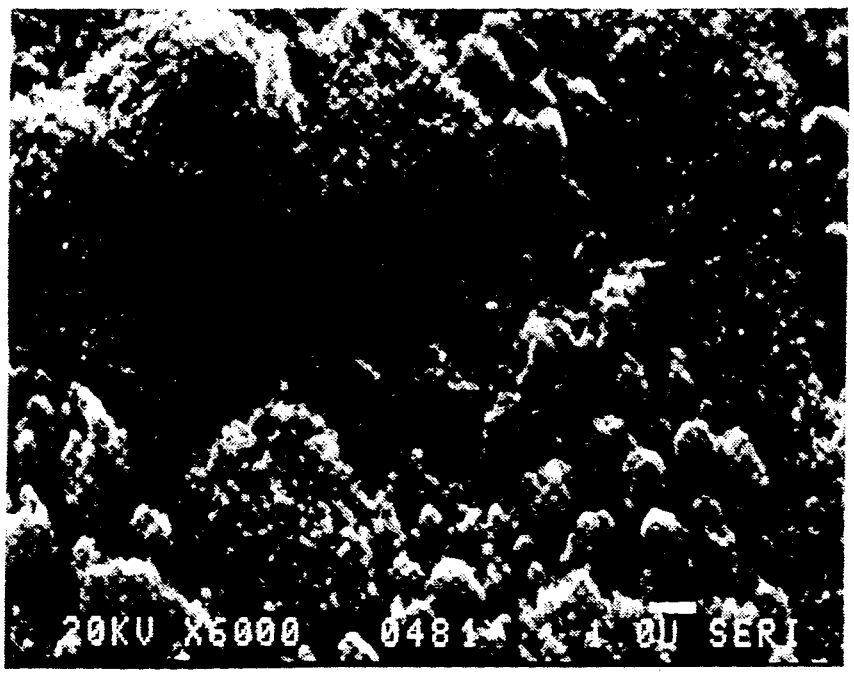
FIG. 3a is a Scanning Electron Micrograph of a $CuInSe_2$ film deposited without the benefit of the present invention, showing the non-uniform morphology obtained.
Figure 3B:
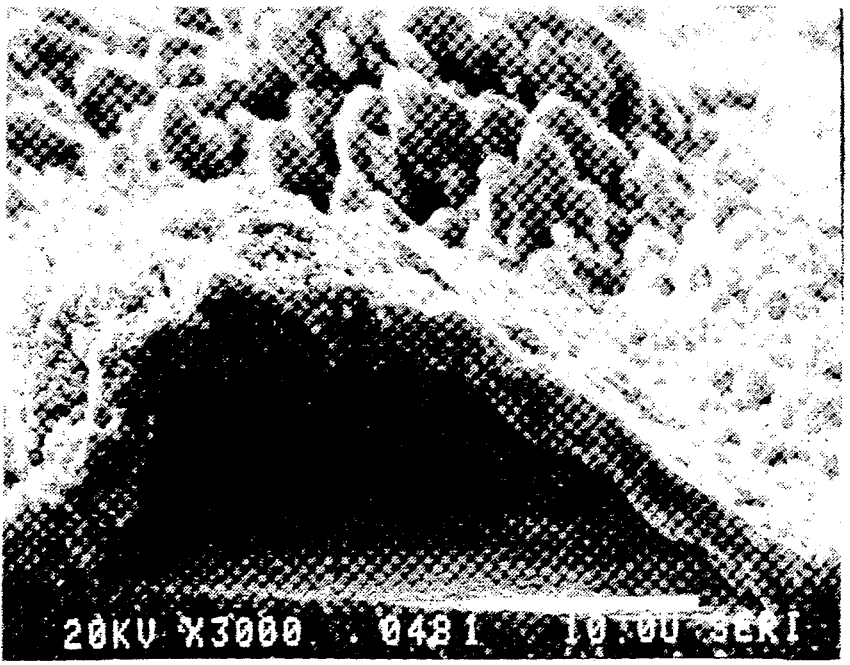
Figure 4:
FIG. 4 is a Scanning Electron Micrograph of a $CuInSe_2$ film deposited using the teachings of the present invention and demonstrating the improvement in morphology and adhesion of the film.

A Mo coated glass substrate was used in this example. A Mo layer was electron-beam (E-Beam) evaporated onto the glass substrate. A 2 cm×5 cm piece was cut out of the glass/Mo sample and half of this piece was coated with a 15 Angstrom thick Te layer using the electrodeposition technique. The Te plating electrolyte consisted of an acidic solution with 3000 ppm of HTeO$_2^+$ obtained by dissolving TeO$_2$ in H$_2$SO$_4$. The plating current density was 6mA/cm$^2$. After the Te deposition the sample was rinsed in D.I. water, dried and placed into a vacuum chamber with a multi-pocket E-Beam hearth. Cu and In evaporation charges were placed in separate pockets of the hearth and the system was pumped down to $2 \times 10^{-5}$ Torr. First In and then Cu was evaporated onto the substrate using an evaporation rate of around 20 Angstroms/sec. (It should be noted that this order of evaporation is just the reverse of the order used in all prior art reports. Without the Te interface this order of deposition gives CuInSe$_2$ films that are not suitable for solar cell fabrication.) The copper-to-indium ratio for this sample was adjusted to around 0.88 which corresponds to a high resistivity material. After the evaporation step the sample was placed in a tube furnace where it was reacted for about 1 hour at 400° C. in the presence of a gas mixture consisting of H$_2$Se and Ar. After cooling down the furnace the sample was taken out and observed. The part of the sample that was not plated with Te had a matte appearance and non-uniform color. The region with the Te inter-layer had a mirror finish surface. FIG. 3a shows the Scanning Electron Micrograph of the area which did not have the Te inter-layer. The morphology of this film is very non-uniform. Its surface is rough and grains of various sizes and shapes are visible. There are big voids between the film and the substrate as can be observed from FIG. 3b which is a cross SEM photograph showing the Mo/CuInSe$_2$ interface. The presence of voids at the Mo/CuInSe$_2$ interface is indicative of the adhesion problem referred to before in this manuscript. FIG. 4 is the cross sectional SEM micrograph of the part of the same film which had the inter-layer of Te. No voids are visible at the CuInSe$_2$/Mo interface in this part of the sample. The morphology is smooth and uniform with small grains of uniform size. Adherence is excellent. As we will see in Example 4, these superior mechanical and structural properties of the Group I-III-VI$_2$ film are translated into higher efficiency devices once solar cells are fabricated on such films.

Example 2

Relation between the thickness of the Te-containing interface and the order in which the elemental layers are deposited.

Another set of experiments were carried out to test the effectiveness of the Te inter-layer for the adhesion of the CuInSe$_2$ film. In these experiments samples were prepared in the same way as Example 1 except that in this case the thickness of the Te layer was varied from sample to sample and the order of deposition for the Cu and In layers was changed to "first Cu then In". Results indicated that the thickness of the Te layer in this case had to be at least 50 Angstroms for it to have any effect in improving the adhesion. It was also observed that the overall adhesion of CuInSe$_2$ films to their substrates was better for samples where In layers were evaporated first over the Te inter-layers.

Example 3

Effect of the Te inter-layer on the stoichiometric uniformity in a CuInSe$_2$ film.

Another sample was prepared in the same way as for Example 1. After the formation of the CuInSe$_2$ film, electron microprobe measurements were made on various parts of this sample to evaluate its stoichiometric uniformity (copper-to-indium ratio). The results are given in TABLE 1. It is very clear that areas of the sample with Te inter-layer have a very uniform stoichiometry whereas the region without any Te interlayer is highly non-uniform (copper-to-indium ratio changes from 0.72 to 0.99 from one point to the other in this region). We believe that the presence of Te improves the wetting of the substrate by the In layer which in turn improves the In thickness uniformity. Uniform stoichiometry of the resulting CuInSe$_2$ films eventually translates into better solar cells.

TABLE 1

Results of electron microprobe measurements made on regions of the CuInSe$_2$ film with and without a Te inter-layer.

| AREA# | Te layer thickness (Angstroms) | measured copper-to-indium ratio |
|---|---|---|
| 1 | 0 | 0.72–0.99 |
| 2 | 15 | 0.85 |

Example 4

Effect of the Te inter-layer on the electrical characteristics of solar cells made on CuInSe$_2$ Films.

Figure 5:
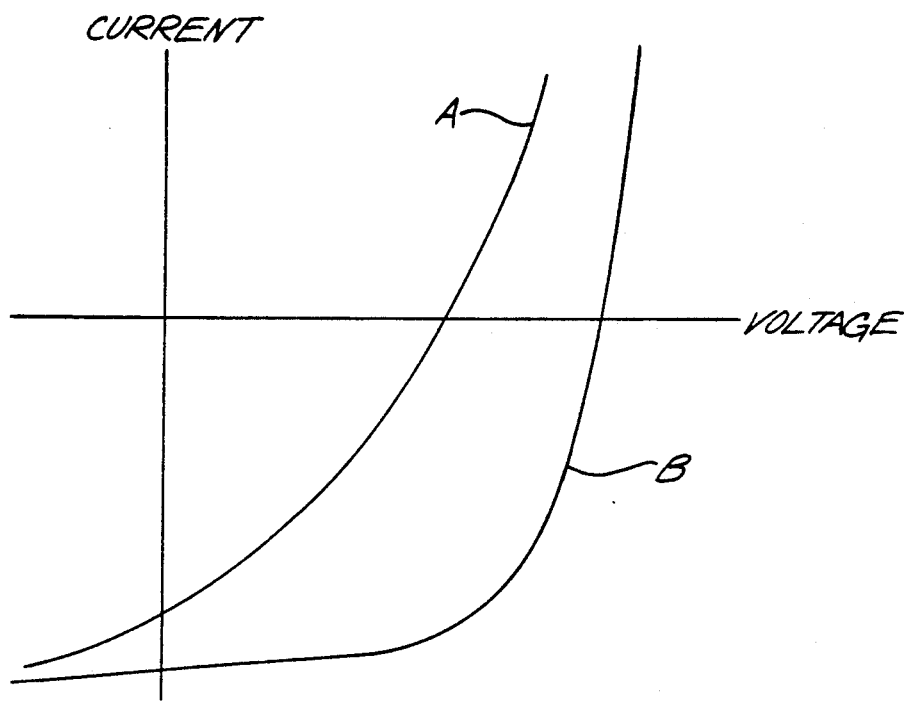
FIG. 5 is a comparison of the illuminated I-V characteristics of two solar cells made on two different $CuInSe_2$ films; one prepared by a prior art method (curve A) and the other prepared in accordance with the present invention (curve B)

Another sample was prepared as in Example 1 and heterojunction solar cells were made on the parts of the CuInSe$_2$ film with and without the Te inter-layer by evaporating an array of 0.1 cm$^2$ area 1.5 micron thick CdS pads. Two micron thick aluminum fingers were used to make contact to the CdS layers. FIG. 5 shows two typical illuminated I-V characteristics of cells made on regions with and without the Te inter-layer. The cell made on the region without the Te inter-layer has a very low efficiency (curve A). Observed low values of the open circuit voltage and the shunt resistance indicate that there are shorted regions in this device. Shorted regions may be the result of pinholes due to the structural imperfections shown in Example 1 and/or they can result from the stoichiometric inhomogeneities as indicated by Example 3. In other words, pinholes or very low-resistivity Cu-rich areas may be responsible for the observed low efficiency for device A.

I–V characteristics of the cell made on the region with the Te inter-layer (curve B) shows a very marked improvement as compared to the device of curve A. Voc, Jsc, fill factor and the efficiency values of this device are 0.429V, 29.22 mA/cm$^2$, 64.65% and 8.1% respectively. With a proper highly transparent window layer and an A/R coating this device efficiency translates into a value above 10% indicating the superior quality of films prepared in accordance with the present invention.

Example 5

High Efficiency cells containing Ga made in accordance with the present invention.

Addition of Ga into the CuInSe$_2$ film is expected to increase the open circuit voltage of the cells and improve the efficiency of the devices. We have applied the method of the present invention to the incorporation of Ga into the CuInSe$_2$ films.

Figure 6:
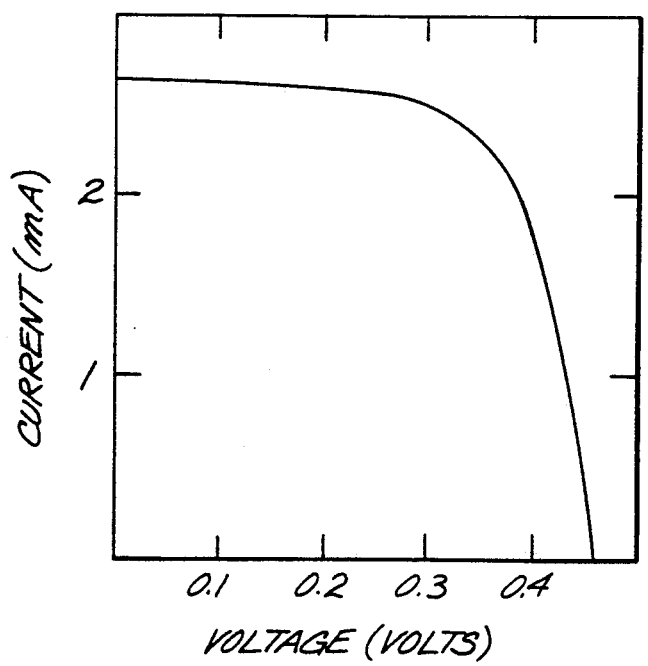
FIG. 6 is the illuminated I-V characteristics of a high efficiency solar cell which is made in accordance with the present invention and which contains Ga in addition to In in its absorber layer.

A Glass/Mo substrate was used in this experiment. A 15 Angstrom of Te was electrodeposited on the Mo film as described in Example 1. Then In, Cu and Ga layers were sequentially deposited over the Te coated substrate using an E-Beam evaporator. The thickness of the In, Cu and Ga layers for this sample were 4000, 2000 and 750 Angstroms respectively. Selenization was carried out in the H$_2$Se containing atmosphere for about 1 hour at 400 C. Devices were made on the resulting films by depositing a transparent window layer that consisted of a 1000 Angstrom thick CdS film, a 8000 Angstrom thick ZnO layer and a 2000 Angstrom thick ITO film. Ni pads were used as ohmic contacts to the window layer. The illuminated I–V characteristics of a device is shown in FIG. 6. The active area (0.075 cm$^2$) efficiency of this device is 10.89% under global, 100mW/cm$^2$ illumination. The open circuit voltage is high due to the incorporation of Ga into the absorber film.

What is claimed is:

1. A method of forming a solar cell comprising:
   depositing onto a substrate an intermediate layer consisting essentially of one or more elements selected from the group consisting of Te, Sn, and Pb;
   depositing a Group I-III-VI$_2$ semiconductor layer onto said intermediate layer,
   wherein said intermediate layer is deposited directly onto said substrate and wherein said substrate may be a conductive material or have a conductive coating thereon.

2. The method set forth in claim 1 wherein said intermediate layer consists essentially of Te.

3. The method set forth in claim 1 wherein a transparent window layer is deposited onto said Group I-III-VI$_2$ semiconductor layer.

4. The method set forth in claim 1 wherein said Group I-III-VI$_2$ semiconductor is selected from the group consisting of selenides, sulfides, and tellurides of Cu, Ag, Al, Ga, In, Tl, and their alloys.

5. The method set forth in claim 1 wherein said Group I-III-VI$_2$ semiconductor is CuIn$_{1-x}$Ga$_x$Se$_2$, wherein x may vary from 0 to 1.

6. A method of forming a solar cell comprising:
   depositing onto a substrate an intermediate layer consisting essentially of one or more elements selected from the group consisting of Te, Sn, and Pb;
   depositing a Group I-III-VI$_2$ semiconductor layer onto said intermediate layer, said Group I-III-VI$_2$ semiconductor layer containing elemental components selected from the group consisting of Cu, y, Ag, Al, Ga, In, Tl, S, Te and Se,
   wherein said intermediate layer is deposited directly onto said substrate and wherein said substrate may be a conductive material or have a conductive coating thereon, and wherein at least two of said elemental components of the Group I-III-VI$_2$ semiconductor are deposited onto the intermediate layer, and wherein the substrate and all the layers deposited thereon are annealed at a temperature range of from about 350° C. to about 600° C.

7. The method set forth in claim 6 wherein said intermediate layer consists essentially of Te.

8. The method as set forth in claim 7 wherein said elemental components of said Group I-III-VI$_2$ semiconductor layer are selected from the group consisting of Cu, Ag, Al, Ga, In, and Tl, and wherein said annealing is carried out in an atmosphere comprising Se or H$_2$Se and/or S or H$_2$S vapors.

9. The method as set forth in claim 6 wherein said elemental components of said Group I-III-VI$_2$ semiconductor layer are selected from the group, consisting of Cu, Ag, Al, Ga, In, and Tl and wherein said elemental components are deposited onto said intermediate layer as separate discrete layers, and wherein said annealing is carried out in an atmosphere comprising Se or H$_2$Se and/or S or H$_2$S vapors.

10. The method as set forth in claim 6 wherein said elemental components of said Group I-III-VI$_2$ semiconductor layer are Cu, Ga, and In, and said annealing is carried out in an atmosphere comprising Se vapor or H$_2$Se.

11. The method as set forth in claim 6 wherein said elemental components of said Group I-III-VI$_2$ semiconductor layer are Cu and In, and said annealing is carried out in an atmosphere comprising Se vapor or H$_2$Se.

12. The method as set forth in claim 6 wherein said elemental components of said Group I-III-VI$_2$ semiconductor layer are deposited onto said intermediate layer in the sequence of In, Cu, and Ga and wherein said annealing is carried out in an atmosphere comprising Se vapor or H$_2$Se.

13. The method as set forth in claim 6 wherein said elemental components of said Group I-III-VI$_2$ semiconductor layer are deposited on said intermediate layer in the sequence of In and Cu, and wherein said annealing is carried out in an atmosphere comprising Se vapor or H$_2$Se.

14. The method set forth in claim 6 wherein a transparent window layer is deposited onto said Group I-III-VI$_2$ semiconductor layer.

15. A solar cell comprising:
   a substrate;
   an intermediate layer deposited onto said substrate, said intermediate layer consisting essentially of Te, Sn, and Pb;
   a Group I-III-VI$_2$ semiconductor layer deposited onto said intermediate layer,
   wherein said intermediate layer is deposited directly onto said substrate and wherein said substrate may be a conductive material or have a conductive coating thereon.

16. A solar cell as set forth in claim 17 wherein said intermediate layer consists essentially of Te.

17. A solar cell set forth in claim 15 wherein a window layer is deposited onto said Group I-III-VI$_2$ semiconductor layer.

18. A solar cell set forth in claim 15 wherein said Group I-III-VI$_2$ semiconductor is selected from the group consisting of selenides, sulfides, and tellurides of Cu, Ag, Al, Ga, In, Tl, and their alloys.

19. A solar cell set forth in claim 15 wherein said Group I-III-VI$_2$ semiconductor is CuIn$_{1-x}$Ga$_x$Se$_2$, wherein x may vary from 0 to 1.

20. A solar cell comprising a substrate;
an intermediate layer deposited onto said substrate, said intermediate layer consisting essentially of one or more elements selected from the group consisting of Te, Sn, and Pb;
a Group I-III-VI$_2$ semiconductor layer deposited onto said intermediate layer, said Group I-III-VI$_2$ semiconductor layer containing elemental components selected from the group consisting of Cu, Ag, Al, Ga, In, Tl, S, Te, and Se.
wherein said intermediate layer is deposited directly onto said substrate and wherein said substrate may be a conductive material or have a conductive coating thereon and wherein at least two of said elemental components of the Group I-III-VI$_2$ semiconductor are deposited onto the intermediate layer, and wherein the substrate and all the layers deposited thereon are annealed at a temperature range of from about 350° C. to about 600° C.

21. A solar cell set forth in claim 20 wherein said intermediate layer consists essentially of Te.

22. A solar cell as set forth in claim 20 wherein said elemental components of said Group I-III-VI$_2$ semiconductor layer are selected from the group consisting of Cu, Ag, Al, Ga, In, and Tl, and wherein said annealing is carried out in an atmosphere comprising Se or H$_2$Se and/or S or H$_2$S vapors.

23. A solar cell as set forth in claim 20 wherein said elemental components of said Group I-III-VI$_2$ semiconductor layer are selected from the group consisting of Cu, Ag, Al, Ga, In, and Tl, and wherein said elemental components are deposited onto said intermediate layer as separate discrete layers, and wherein said annealing is carried out in an atmosphere comprising Se or H$_2$Se and/or S or H$_2$S vapors.

24. A solar cell as set forth in claim 20 wherein said elemental components of said Group I-III-VI$_2$ semiconductor layer are Cu, Ga, and In, and said annealing is carried out in an atmosphere comprising Se vapor or H$_2$Se.

25. A solar cell as set forth in claim 20 wherein said elemental components of said Group I-III-VI$_2$ semiconductor layer are Cu and In, and said annealing is carried out in an atmosphere comprising Se vapor or H$_2$Se.

26. A solar cell as set forth in claim 20 wherein said elemental components of said Group I-III-VI$_2$ semiconductor layer are deposited onto said intermediate layer in the sequence of In, Cu, and Ga, and wherein said annealing is carried out in an atmosphere comprising Se vapor or H$_2$Se.

27. A solar cell as set forth in claim 20 wherein said elemental components of said Group I-III-VI$_2$ semiconductor layer are deposited on said intermediate layer in the sequence of In and Cu, and wherein said annealing is carried out in an atmosphere comprising Se vapor or H$_2$Se.

28. A solar cell as set forth in claim 20 wherein a transparent window layer is deposited onto said Group I-III-VI$_2$ semiconductor layer.

* * * * *

UNITED STATES PATENT AND TRADEMARK OFFICE
CERTIFICATE OF CORRECTION

PATENT NO. : 5,028,274
DATED : July 2, 1991
INVENTOR(S) : BULENT M. BASOL ET AL

It is certified that error appears in the above-identified patent and that said Letters Patent is hereby corrected as shown below:

```
Col. 2, line 39, after "even" change "a" to -- an --
Col. 4, line 3, change "Secontaining" to -- Se-containing --
Col. 4, line 27, change "D. Dimmler" to -- B. Dimmler --
Col. 4, line 50, change "Secontaining" to -- Se-containing --
Col. 5, line 8, after "Such" insert -- a --
Col. 8, line 11, after "step" insert -- 24) --
Col. 8, line 47, after "sputtering" insert a comma
Col. 8, line 64, change "Ga" to -- Ga) --
Col. 9, line 51, change "inter-layer" to -- interlayer --
Col. 9, line 55, after "cross" insert -- sectional --
Col. 10, lines 7, 22, 42, 49, 54, 59, & 60, change "inter-layer"
   to -- interlayer -- (all occurrences)
Col. 10, line 18, change "inter-layers" to -- interlayers --
Col. 10, line 30, change "inter-layer" to -- interlayers --
Col. 10, line 66, change "inhomogeneities" to -- homogeneities --
Col. 11, line 4, change "inter-layer" to interlayer --
Col. 11, line 30, change "400 C." to 400°C --
Col. 11, line 32, change "a 8000 Angstrom" to -- an 8000
   angstrom --
```

UNITED STATES PATENT AND TRADEMARK OFFICE
CERTIFICATE OF CORRECTION

PATENT NO. : 5,028,274
DATED : July 2, 1991
INVENTOR(S) : BULENT M. BASOL ET AL

It is certified that error appears in the above-identified patent and that said Letters Patent is hereby corrected as shown below:

```
Col. 12, line 2 (Claim 6, line 8), change "Cuy" to -- Cu --
Col. 12, line 16 (Claim 8, line 1), change "7" to -- 6 --
Col. 12, line 52 (Claim 14, line 1), after "method" insert
   -- as --
Col. 12, line 59 (Claim 15, line 4), after "essentially of"
   insert -- one or more elements selected from the group
   consisting of --
Col. 12, line 67 (Claim 16, line 1), change "17" to -- 15 --
Col. 13, line 1 (Claim 17, line 1), after "cell" insert
   -- as --
Col. 13, line 4 (Claim 18, line 1), after "cell" insert
   -- as --
Col. 13, line 8 (Claim 19, line 1), after "cell" insert
   -- as --
Col. 13, line 30 (Claim 21, line 1), after "cell" insert
   -- as --
```

Signed and Sealed this

Twenty-ninth Day of December, 1992

Attest:

DOUGLAS B. COMER

*Attesting Officer*     *Acting Commissioner of Patents and Trademarks*